US009110113B2

(12) United States Patent
Grosjean et al.

(10) Patent No.: US 9,110,113 B2
(45) Date of Patent: Aug. 18, 2015

(54) METHOD OF MEASURING A PHYSICAL PARAMETER AND ELECTRONIC INTERFACE CIRCUIT FOR A CAPACITIVE SENSOR FOR IMPLEMENTING THE SAME

(71) Applicant: EM MICROELECTRONIC-MARIN SA, Marin (CH)

(72) Inventors: Sylvain Grosjean, Les Fins (FR); Christophe Entringer, Corcelles-pres-Conscise (CH)

(73) Assignee: EM MICROELECTRONICS-MARIN SA, Marin (CH)

( * ) Notice: Subject to any disclaimer, the term of this patent is extended or adjusted under 35 U.S.C. 154(b) by 204 days.

(21) Appl. No.: 13/867,722

(22) Filed: Apr. 22, 2013

(65) Prior Publication Data
US 2013/0300437 A1    Nov. 14, 2013

(30) Foreign Application Priority Data

May 10, 2012  (EP) ..................................... 12167469

(51) Int. Cl.
  *G01R 27/26*  (2006.01)
  *G01D 5/241*  (2006.01)
(52) U.S. Cl.
  CPC ............ *G01R 27/2605* (2013.01); *G01D 5/241* (2013.01)
(58) Field of Classification Search
  CPC ........................... G01D 5/241; G01R 27/2605
  USPC ........................... 324/658–690; 345/173–178
  See application file for complete search history.

(56) References Cited

U.S. PATENT DOCUMENTS

| 2008/0197861 A1* | 8/2008 | Grosjean et al. .............. 324/661 |
| 2010/0231237 A1* | 9/2010 | Deschildre et al. ........... 324/661 |

FOREIGN PATENT DOCUMENTS

| EP | 0 525 830 A1 | 2/1993 |
| EP | 1 835 263 A1 | 9/2007 |
| EP | 2 343 507 A1 | 7/2011 |
| FR | 2 176 724 A1 | 11/1973 |
| WO | 2004/113930 A1 | 12/2004 |
| WO | 2008/107737 A1 | 9/2008 |

OTHER PUBLICATIONS

Yen S. Lee et al., "A 1 mV MOS Comparator", IEEE Journal of Solid-State Circuits, Jun. 1978, pp. 294-297, vol. SC-13, No. 3.
H. Leuthold et al., "An ASIC for high-resolution Capacitive Microaccelerometers", Sensors and Actuators, A21-A23, 1990, pp. 278-281.
Yen S. Lee et al., "A 1 mV MOS Comparator", IEEE Journal of Solid-State Circuits, Jun. 1978, pp. 294- 297, vol. SC-13, No. 3.

\* cited by examiner

*Primary Examiner* — Arleen M Vazquez
*Assistant Examiner* — Robert P Alejnikov, Jr.
(74) *Attorney, Agent, or Firm* — Sughrue Mion, PLLC

(57) ABSTRACT

A physical parameter is measured via an electronic circuit connected to a two capacitor sensor. The circuit includes an amplifier connected to the common capacitor electrode, a logic unit for digital processing amplifier data and supplying a digital measuring signal, a digital-analog converter for supplying a measuring voltage based on the digital measuring signal, a switching unit for alternately supplying the measuring voltage to the first and second fixed capacitor electrodes, and a regulated voltage for negative biasing or a low voltage for positive biasing from a voltage supply source. A first phase consists in biasing the first fixed electrode with the measuring voltage from first binary word and reference voltage, and the second fixed electrode with low voltage, and a second phase consists in biasing the second fixed electrode with measuring voltage from second binary word, which is reverse of the first binary word, and the reference voltage.

11 Claims, 2 Drawing Sheets

METHOD OF MEASURING A PHYSICAL PARAMETER AND ELECTRONIC INTERFACE CIRCUIT FOR A CAPACITIVE SENSOR FOR IMPLEMENTING THE SAME

This application claims priority from European Patent Application No. 12167469.1 filed May 10, 2012 the entire disclosure of which is incorporated herein by reference.

FIELD OF THE INVENTION

The invention concerns a method of measuring a physical parameter, such as an acceleration, angular speed, force or pressure, by means of an electronic interface circuit connected to a capacitive sensor.

The invention also concerns an electronic interface circuit for a capacitive sensor for implementing the measuring method. The capacitive sensor is formed of at least two differential connected capacitors. A common electrode of the capacitors is capable of moving between two fixed electrodes under the action, for example, of a force in order to alter the capacitive value of each capacitor.

BACKGROUND OF THE INVENTION

In a simple conventional capacitive sensor design, the common electrode, which is mobile, forms part of an armature resiliently held between the two fixed electrodes. In this case, the capacitive sensor may be capable of performing a measurement along one direction of movement of the moving electrode. At rest, this common moving electrode is normally equidistant from the two fixed electrodes in order to have two capacitors with an equal capacitance value. The common moving electrode can move some distance in the direction of one or other of the fixed electrodes under the action of a force. Thus the capacitive value of each capacitor varies inversely. The electronic interface circuit connected to the capacitive sensor thus enables an analogue output signal to be supplied. This analogue output signal takes the form of a voltage dependent on the capacitance variation of the two capacitors.

This electronic interface circuit for a capacitive sensor is disclosed in the article by Messrs H. Leuthold and F. Rudolph, which appeared in the journal entitled "Sensors and actuators" A21-A23 (1990), pages 278 to 281.

The capacitive sensor may be an accelerometer for performing an acceleration measurement in conjunction with an electronic interface circuit. It may be a single axis accelerometer like the aforementioned capacitive sensor, or a multi-axis or tri-axis accelerometer for performing a measurement in three directions X, Y and Z. A tri-axis MEMS accelerometer of this type may include a single mass, i.e. a common inertial mass for the three pairs of differential capacitors, or three masses for the pairs of capacitors. In the first case, a single common electrode and six fixed electrodes are provided, whereas in the second case, one common electrode and two fixed electrodes are provided for each pair of capacitors.

Both the electronic circuit and the capacitive sensor, such as a MEMS accelerometer, are made in a semiconductor substrate. Consequently, stray capacitances at the electronic circuit input are added to the capacitances of the capacitors of the MEMS capacitive sensor. These stray capacitances do not depend on the motion of the moving electrode, which consequently creates non-linearities and also lowers the sensitivity or gain of the electronic circuit. The same is true with the MEMS capacitive sensor, where the potential of the substrate during operation of the sensor also creates non-linearities. Thus, the mean electrostatic force is not zero in the sensor and electronic circuit off mode. Because of the influence of the substrate potential on the electrostatic force, this leads to a variation in the measured real force, which is applied across the common moving electrode, which is a drawback.

To carry out a force, acceleration or pressure measurement using the electronic circuit, the fixed electrodes of two capacitors or pairs of capacitors are biased or excited cyclically by voltages of opposite polarity relative to an off reference voltage. By biasing or polarizing the two fixed electrodes at different voltage levels, the charge difference across the moving electrode can be measured and converted into at least one electronic circuit output voltage. When the output voltage or voltages are stabilised at their final value, the total charge across the moving electrode becomes zero. Consequently, these output voltages are supplied sampled to a processing circuit.

Since the measurement of a force, acceleration or pressure is dependent on the aforementioned non-linearities and on any voltage offset linked to unmatched electronic components, EP Patent No. 1 835 263 B1 proposes a solution to this problem. A symmetrical double structure is proposed in the electronic circuit, particularly with two integrators following the charge transfer amplifier. Each integrator supplies a corresponding analogue output voltage at output according to positive electrode biasing or negative electrode biasing. Because of this, a voltage offset due to technology or to the variation in supply voltage can be minimised or eliminated using the two analogue integrator output voltages. Moreover, the substrate potential is no longer of any importance given that the electronic circuit includes an identical double structure operating in total symmetry.

However, one drawback of the electronic circuit of EP Patent No 1 835 263 B1 is that it supplies output signals, such as output voltages, in analogue form. This requires the use of two integrators. This means that it is not possible to sufficiently reduce the size of the integrated components and the electrical power consumption of the integrated electronic circuit. Moreover, the electronic circuit is only arranged to perform a measurement with one capacitive sensor along a single measurement axis.

It is thus preferred to make an electronic circuit which supplies digital measuring signals at output. WO Patent Application No. 2004/113930 A1, which discloses an electronic circuit of this type connected to a single axis or multi-axis capacitive sensor for measuring an acceleration, can be cited in this regard. A logic circuit specific to each measurement axis, which processes digital measuring signals, is provided after the charge transfer amplifier, which is connected to the common moving electrode. The output of each logic circuit supplies a binary measuring signal representative of a measuring voltage level dependent on the movement of the moving electrode relative to the fixed electrodes for each axis in succession. The binary measuring signal for each axis is supplied in succession to a digital-analogue converter. In one phase of each measuring cycle for a selected axis, this converter supplies a measuring voltage to the electrodes alternately with a phase of biasing the fixed electrodes at a high voltage and a low voltage from a supply voltage source. The binary signal obtained at the output of each logic is incremented or decremented by one unit at each series of measuring phases, until the total charge across the moving electrode becomes zero. Although the size of the electronic components and the electrical power consumption are reduced, the aforementioned non-linearities and voltage offsets are not removed, which is a drawback. Moreover, the stabilising time of the digital output signal for each measurement axis is relatively long, which is another drawback.

Like the preceding document, WO Patent Application No. 2008/10773 A1 discloses an electronic interface circuit for an acceleration measuring sensor. An analogue measurement signal is stored after a charge transfer amplifier in one phase of a measuring cycle after the fixed electrodes of the capacitor have been biased. The analogue signal is converted into a digital signal stored in a logic of the electronic circuit. The stored digital signal is subsequently converted by a digital-analogue converter into an analogue return signal in the form of a voltage, which is applied to all the sensor electrodes in a successive phase of each measuring cycle. In a measuring cycle, the fixed electrodes are biased in succession by a first biasing and a second biasing which is the reverse of the first biasing. This enables leakage currents to be removed from the electronic circuit. However, a large number of steps are necessary to obtain a physical parameter measuring signal at output, which is a drawback.

EP Patent Application No. 2 343 507 A1 discloses an electronic interface circuit for a single axis or tri-axis measuring sensor. The measuring signals are digitally processed after the charge transfer amplifier in a logic unit. Following positive biasing and negative biasing, digital measuring signals are stored in corresponding registers of the logic unit. A digital-analogue converter is also used for successively converting the digital signals for each axis in a measuring cycle into a voltage at the sensor electrodes. To obtain final measurement values for the acceleration for each axis, a dichotomy algorithm is first of all used in the logic unit for a certain number of measuring cycles, prior to finishing with oversampling steps. With this dichotomy algorithm, the measurement always starts, during each conversion, at half the measurement range, in particular at $V_{REG}/2$. If an error occurs during this first measurement with a large change step in the logic unit, the final value at the end of all the measuring cycles will inevitably be erroneous, which is a drawback.

SUMMARY OF THE INVENTION

It is thus an object of the invention to overcome the aforementioned drawbacks of the state of the art by providing a method of measuring a physical parameter by means of an electronic interface circuit, connected to a capacitive sensor, which, in accordance with a new electrode excitation scheme, increases the signal to noise ratio at low voltage and rapidly supplies precise output signals.

The invention therefore concerns a method of measuring a physical parameter by means of an electronic interface circuit connected to a capacitive sensor, which includes at least first and second differential-connected capacitors, whose common electrode is capable of moving relative to each fixed electrode of the two capacitors to modify the capacitive value of each capacitor when the physical parameter is measured, said electronic circuit including a charge transfer amplifier, which is connected to the common electrode, a logic unit connected to the amplifier output for digital processing of the data supplied by the amplifier and for supplying at least one digital measuring signal, a digital-analogue converter for supplying a measuring voltage, which is defined on the basis of conversion of at least a first binary word or a second binary word relating to the digital measuring signal, a switching unit for alternately supplying each fixed electrode of the two capacitors with the measuring voltage and a regulated voltage or a low voltage from a supply voltage source, the method including, in each successive measuring cycle, steps consisting in:

a) in a first phase, biasing the fixed electrode of the first capacitor via the switching unit with a first measuring voltage supplied by the digital-analogue converter, and the fixed electrode of the second capacitor with the low voltage for defined positive biasing of the electrodes, or the regulated voltage for defined negative biasing of the electrodes, the first measuring voltage being defined on the basis of the first binary word relating to the digital measuring signal from a preceding cycle or an initial binary reference word supplied by the logic unit, and according to a reference voltage generated in the digital-analogue converter for positive biasing, or according to an inverted reference voltage generated in the digital-analogue converter for negative biasing, the inverted reference voltage corresponding to the difference between the regulated voltage and the reference voltage, which is set at a value higher than half of the regulated voltage, b) in a second phase, biasing the fixed electrode of the second capacitor via the switching unit with a second measuring voltage supplied by the digital-analogue converter and the fixed electrode of the first capacitor with the low voltage or the regulated voltage, the second measuring voltage being defined on the basis of the second binary word relating to the digital measuring signal or the initial reference binary signal supplied by the logic unit, and according to the reference voltage, if positive biasing is selected in the first phase, or according to the inverted reference voltage, if negative biasing is selected in the first phase, the second binary word being defined in the logic unit as the reverse of the first binary word relative to the reference binary word, and c) incrementing or decrementing by a determined step in the logic unit, the digital measuring signal according to the increase or decrease in charge injection quantity across the moving electrode on the basis of the voltage variation across the fixed electrode of the first capacitor and the voltage variation across the fixed electrode of the second capacitor at the change from the first phase to the second phase.

Particular steps of the measuring method are defined in the dependent claims 2 to 7.

One advantage of the measuring method lies in the fact that at least one digital output signal for a physical parameter measurement can be quickly supplied at the electronic circuit output. Due to a significant variation in the excitation voltage applied to each fixed electrode of the capacitors from a first phase to a second phase of measuring the positive biasing and/or negative biasing, the signal to noise ratio is improved without increasing the current used and at a low supply voltage.

The initial biasing voltage of one or other fixed electrode provided by the digital-analogue converter is no longer set at half the measuring range, but close to the regulated supply voltage in positive biasing and close to the low voltage in negative biasing. This means that, at each transition phase, it is possible to have a significant voltage variation across each fixed electrode and thus a quantity of collected charges proportional to the change in voltage across each fixed electrode from one phase to the next. This provides improved sensitivity and a signal to noise ratio which may be around 1.65 times higher than the signal to noise ratio of a state of the art measuring method.

The invention therefore also concerns the aforecited electronic interface circuit for a capacitive sensor, which includes a pair of differential-connected capacitors, for implementing the measuring method, the electronic circuit including a charge transfer amplifier to be connected to the common electrode of the capacitors, a logic unit connected to the amplifier output for digital processing of data supplied by the amplifier and for supplying at least one digital measuring signal, a digital-analogue converter for supplying a measuring voltage, which is defined on the basis of conversion of at least a first binary word or a second binary word relating to the digital measuring signal, a switching unit capable of alternately supplying each fixed electrode of the two capacitors with the measuring voltage, and a regulated voltage or a low voltage from a supply voltage source, characterized in that the digital-analogue converter includes a resistive divider for generating a reference voltage for positive biasing of the fixed electrodes of the capacitors, or an inverted reference voltage for negative biasing of the fixed electrodes, each node of the resistors of the resistive divider being connected to a multiplexer, which may be controlled by the first binary word or the second binary word to allow the digital-analogue converter to supply a first measuring voltage on the basis of the first binary word and the reference voltage or the inverted reference voltage, and a second measuring voltage on the basis of the second binary word and the reference voltage or the inverted reference voltage.

Specific embodiments of the electronic circuit are defined in the dependent claims 9 to 11.

One advantage of the electronic interface circuit for a capacitive sensor lies in the fact that it can quickly provide stabilised digital measuring signals at output as a result of digital processing immediately after the charge transfer amplifier. These digital measuring signals are processed in the logic unit. Two digital signals may be provided dependent on positive biasing and negative biasing of the fixed electrodes of the capacitors. By combining the digital signals this enables any voltage offset to be removed from the electronic circuit components.

Another advantage of the electronic interface circuit for a physical sensor lies in the fact that the digital-analogue converter includes a resistive divider, each resistive node of which is connected to a multiplexer, which is operated in succession by each binary word stored in a corresponding register of the logic unit. This resistive divider allows the digital-analogue converter to generate a reference voltage Vref established between the middle of the measuring range and the regulated supply voltage. An inverted reference voltage may be generated by inverting the connection of the resistive divider terminals to be connected to the terminals of a supply voltage source supplying the regulated voltage and the low voltage. The digital positive biasing or negative biasing signal instructs the multiplexer to add or remove a positive or negative measuring voltage to or from the reference voltage or to or from the inverted reference voltage, so that the converter supplies an analogue voltage to one or other of the fixed electrodes of the capacitors in each measuring phase. Advantageously, this digital-analogue converter no longer works around the middle of the measurement range, but around the reference voltage for positive biasing and around the inverted reference voltage for negative biasing.

BRIEF DESCRIPTION OF THE DRAWINGS

The objects, advantages and features of the method of measuring a physical parameter and the electronic interface circuit for a capacitive sensor for implementing the same will appear more clearly in the following description with reference to the drawings, in which.

DETAILED DESCRIPTION OF THE INVENTION

In the following description, reference will mainly be made to the new method of measuring a physical parameter by means of an electronic interface circuit connected to a capacitive sensor for supplying at least one digital measuring signal at the electronic circuit output.

Figure 1:
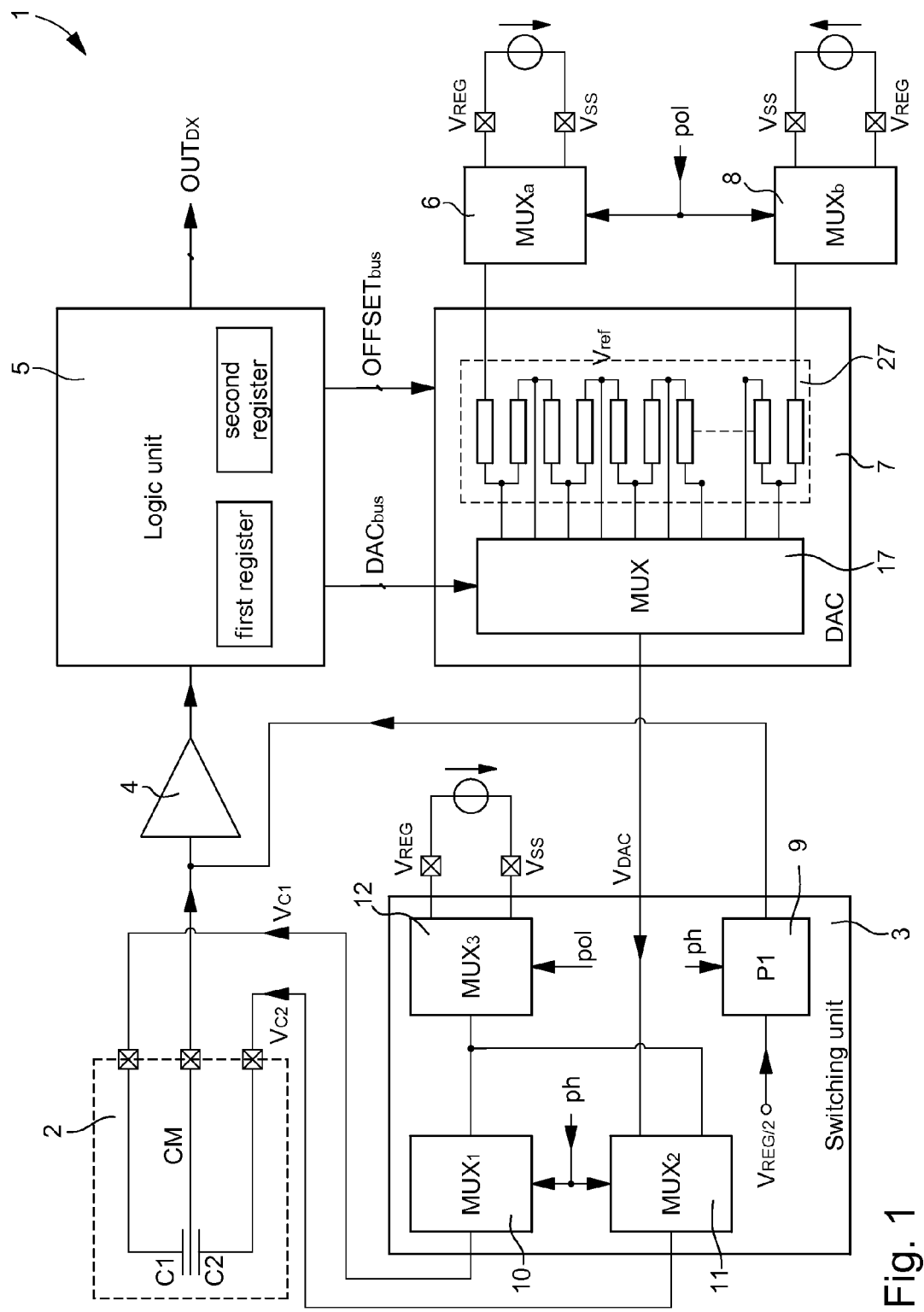
FIG. 1 shows a simplified view of an electronic interface circuit connected to a capacitive sensor for implementing the method of measuring a physical parameter according to the invention.

FIG. 1 shows a simplified diagram of the various components of electronic interface circuit 1 for a capacitive sensor 2 for implementing the physical parameter measuring method according to the invention. In this embodiment, a MEMS capacitive sensor 2 with a single mass is arranged to be connected to electronic circuit 1. This capacitive sensor is thus formed of a pair of capacitors C1 and C2. The two capacitors of each pair are differential connected. A common electrode CM of the pair of capacitors can be moved under the action, in particular, of a force between the two fixed electrodes to perform a physical parameter measurement. Of course, it is also possible to use a tri-axial capacitive sensor, for example, with a common electrode for the three pairs of capacitors for a physical parameter measurement along three measuring axes X, Y and Z.

Electronic circuit 1 can supply at least one digital measuring signal, which relates to a physical parameter, such as an acceleration, angular speed, pressure or force, according to the movement of the common moving electrode between the two fixed electrodes. In the case of an acceleration measurement, the electronic circuit can be configured to supply at least one digital measuring signal between minimum and maximum acceleration values. One may choose, for example, to configure the electronic circuit to supply digital measuring signals within the acceleration range of −2 g to +2 g. A voltage variation of around 3 to 20 mV may be allowed for 1 g of acceleration.

Moving common electrode CM may form part of the armature of the sensor resiliently held in a central position at rest between the two fixed electrodes of capacitors C1 and C2. Electronic circuit 1 may be powered by a continuous supply voltage source (not shown). This supply voltage source supplies a regulated high voltage $V_{REG}$ at a first terminal and a low voltage $V_{SS}$ at a second terminal. The low voltage can be set at 0 V, whereas the regulated high voltage can be set at 1.65 V for example, or slightly lower. The fixed electrode of each capacitor can be biased in one phase of a measuring cycle having two phases or four phases, as explained below, either at high voltage $V_{REG}$ or at low voltage $V_{SS}$ or at an analogue voltage $V_{DAC}$ of a preceding measurement or an initial value in an operating mode of the electronic circuit.

Figure 2:
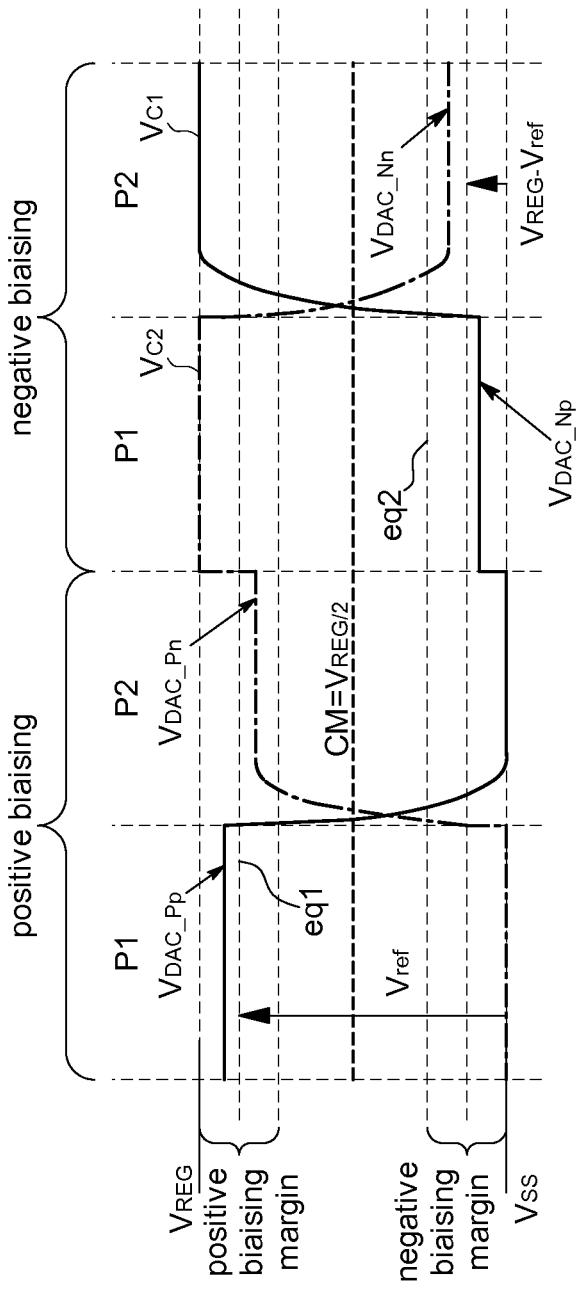
FIG. 2 shows a time diagram of voltage signals applied to the electrodes of the capacitive sensor connected to the electronic interface circuit of the measuring method according to the invention.

According to the physical parameter measuring method, electronic interface circuit 1 may be powered at a minimum regulated voltage $V_{REG}$ according to the new electrode excitation scheme for the capacitive sensor explained in detail below with reference to FIG. 2. Each measuring cycle may be formed of a first series of measuring phases for a defined positive electrode biasing and a second series of measuring phases for a defined negative electrode biasing. The first measuring phase series includes a first phase P1 and a second phase P2 of exciting the fixed electrodes of sensor capacitors C1 and C2, whereas the second measuring phase series includes a first phase P1 and a second phase P2 of successive inverted excitation of the fixed electrodes. With this new excitation scheme, the voltage variation applied to each fixed electrode at the change from the first phase to the second phase is increased for each positive and negative biasing, since the charge injection is proportional to this voltage drop or variation. This means it is possible to have a much better signal to noise ratio than that of any state of the art measuring method, and without requiring any increase in the regulated supply voltage.

Electronic interface circuit 1 includes a comparator type charge transfer amplifier 4, which is directly connected to moving electrode CM of the capacitor pair C1 and C2 or via an additional capacitor arranged in series between moving electrode CM and the input of amplifier 4. The electronic circuit further includes a switching unit 3, which receives voltages $V_{REG}$, $V_{SS}$ and $V_{DAC}$ to be applied to the sensor electrodes according to the measuring cycle phases. Regulated voltage $V_{REG}$ and low voltage $V_{SS}$ are applied alternately to the fixed electrodes according to the measuring phases. The analogue voltage $V_{DAC}$, from a feedback digital-analogue converter 7, is alternately applied to the fixed electrodes according to the measuring phase and positive or negative biasing as explained in detail below.

Switching unit 3 may include a first multiplexer 10 $MUX_1$ for selecting the voltages to be applied to the various electrodes of capacitive sensor 2. This first multiplexer 10 receives at input the regulated voltage $V_{REG}$ or voltage $V_{SS}$ according to the positive or negative biasing of each measuring cycle, and the analogue voltage $V_{DAC}$ supplied by the digital-analogue converter 7. This first multiplexer 10 supplies at output the voltage $V_{C1}$ to be applied to the fixed electrode of capacitor C1. Switching unit 3 may also include a second multiplexer 11 $MUX_2$. This second multiplexer 11 receives at input the regulated voltage $V_{REG}$ or voltage $V_{SS}$ according to the positive or negative biasing of each measuring cycle, and analogue voltage $V_{DAC}$. This second multiplexer 11 supplies at output the voltage $V_{C2}$ to be applied to the fixed electrode of capacitor C2.

The first and second multiplexers 10 and 11 are controlled by a phase control signal ph. When this phase control signal ph is, for example, at state "1", the first multiplexer 10 supplies at output the analogue voltage $V_{DAC}$, whereas second multiplexer 11 supplies at output the low voltage $V_{SS}$ in positive biasing or regulated voltage $V_{REG}$ in negative biasing. When phase control signal ph is for example at state "0", the first multiplexer 10 supplies at output the analogue voltage $V_{SS}$ in positive biasing or regulated voltage $V_{REG}$ in negative biasing, whereas the second multiplexer 11 supplies at output the analogue signal $V_{DAC}$. A third multiplexer 12 $MUX_3$ may be provided to receive at input regulated voltage $V_{REG}$ and low voltage $V_{SS}$. This third multiplexer 12 is controlled by a polarity control signal pol, so that low voltage $V_{SS}$ is supplied at output, when the polarity control signal pol is at state "0", and so that regulated voltage $V_{REG}$ is supplied at output, when polarity control signal pol is at state "1".

Comparator amplifier 4 is of very simple design, of the type disclosed in the article entitled "A 1 mV MOS Comparator" in the journal IEEE, J. Solid-States Circuits, vol. SC-13. pp. 294-297 of June 1978. This comparator amplifier 4 generally includes a capacitor at input connected to common electrode CM, followed by amplifier stages for supplying an all-or-nothing digital signal at output. This charge transfer amplifier has a very high gain. The amplifier output signal is at state "1" close to regulated voltage $V_{REG}$ when the voltage across moving electrode CM increases via the accumulation of positive charges in the measuring cycles. However, the amplifier output signal changes to state "0" close to low voltage $V_{SS}$ when the voltage across moving electrode CM decreases via the accumulation of negative charges in the measuring cycles.

Electronic circuit 1 also includes a logic unit 5, which includes a storage means, which stores, in particular, various configuration parameters. Logic unit 5 of the electronic circuit further includes a processor (not shown) which is clocked by a conventional clock signal, so as to control performance of all the necessary steps of the physical parameter measuring method, particularly for an acceleration. Logic unit 5 further includes at least two registers (not shown) for storing digital signals in the form of binary measuring words. A first register receives a first digital measuring signal arising from the increase or decrease in charge injection across moving electrode CM following a defined positive biasing (pol at "0") of the fixed electrodes of the capacitor pair. A second register receives a second digital measuring signal arising from the increase or decrease in charge injection across the moving electrode CM following a defined negative biasing (pol at "1") of fixed electrodes C1 and C2 of the corresponding capacitor pair. Negative biasing is simply an inverted biasing of the positive biasing.

By combining or adding two registers in a combination element (not shown), logic unit 5 supplies a digital output signal $OUT_{DX}$. Any voltage offset has advantageously been removed from this digital output signal by combining the digital measuring signals of the two combined registers, Logic unit 5 also supplies a binary adjusting word OFFSET-bus (over 10 bits or 11 bits) to the digital-analogue converter to compensate for any voltage offset relating to the MEMS sensor at input.

During each measuring cycle, the first digital signal and the second digital signal stored in a corresponding register are incremented or decremented by a certain digital value according to a determined programmed step. The incrementing or decrementing continues until each digital signal has stabilised after a certain number of successive measuring cycles. In each measuring cycle, the digital measuring signals or binary words DACbus stored in the registers are supplied in succession to digital-analogue converter 7 taking account of the measuring phase. Each digital measuring signal provided by electronic circuit 1 is proportional for two capacitors C1 and C2 to $(Cs1-Cs2)/(Cs1+Cs2)$, where Cs1 is the capacitive value of capacitor C1 and Cs2 is the capacitive value of capacitor C2. Once each digital measuring signal has stabilised at a final physical parameter measurement, any charge flow across the two capacitors of each pair is cancelled out.

Digital-analogue converter 7, as explained below, converts the digital signals into an analogue voltage $V_{DAC}$ to be supplied to the fixed electrodes respectively according to phase and biasing in each measuring cycle. In analogue voltage $V_{DAC}$ and for positive biasing, a reference voltage Vref generated in digital-analogue converter 7 is also added to a positive or negative converted voltage Vp from a first digital measuring signal from logic unit 5. In analogue voltage $V_{DAC}$ and for negative biasing, an inverted reference voltage $V_{REG}$-Vref is also added to a positive or negative converted voltage Vn from a second digital measuring signal from logic unit 5.

This reference voltage Vref is generated by a resistive divider 27 of digital-analogue converter 7. This resistive divider may have more than 1000 well matched resistors of the same resistive value, for example 1536 individual resistors. This reference voltage Vref is selected to be between a voltage value of $V_{REG}/2$ and $V_{REG}$ to increase the signal to noise ratio. This reference voltage can preferably be selected to be as close as possible to regulated voltage $V_{REG}$ and at least 1.5 times higher than the value of voltage $V_{REG}/2$. This reference voltage may be selected for example with a value of around 1.36 V or 1.4 V to also take account of any offset connected to the MEMS capacitive sensor.

It is to be noted that, at the start of any measurement, each binary word DACbus supplied is for example centred on the middle of the measurement range. Passing through the digital-analogue converter, this means that the measurement range in positive biasing is located around the reference voltage Vref, whereas the measurement range in negative biasing is located around the inverted reference voltage $V_{REG}$–Vref. At the start of each measurement, the binary words of the registers, which are supplied in succession to the digital-analogue converter, may be reinitialised in the middle of the measuring range, i.e. at 512 for a digital range from 0 to 1023 (10 bits). The middle of the measuring range corresponds to a binary reference word in the logic unit. However, by supplying the binary word with a value 512 to multiplexer 17 of digital-analogue converter 7, said multiplexer supplies at output, as analogue voltage $V_{DAC}$, either reference voltage Vref, or inverted reference voltage $V_{REG}$–Vref according to the biasing.

A first supply multiplexer 6 $MUX_a$ and a second supply multiplexer 8 $MUX_b$ are provided for generating reference voltage Vref and inverted reference voltage $V_{REG}$–Vref of digital-analogue converter 7. The first and second multiplexers 6 and 8 are arranged to receive at input regulated voltage $V_{REG}$ and low voltage $V_{SS}$. These supply multiplexers 6 and 8 are controlled by a polarity control signal pol.

When polarity control signal pol is at state "0" for positive biasing, first supply multiplexer 6 supplies the regulated voltage $V_{REG}$ at output to a first terminal of resistive divider 27, while the second supply multiplexer 8 supplies the low voltage $V_{SS}$ to a second terminal of the resistive divider to power said resistive divider 27. Thus the reference voltage Vref is set in the converter. When this polarity control signal pol is at state"1" for negative biasing, first supply multiplexer 6 supplies the low voltage $V_{SS}$ at output, while the second supply multiplexer 8 supplies regulated voltage $V_{REG}$ to inversely power resistive divider 27. Thus, the inverted reference voltage $V_{REG}$–Vref is set in the converter.

The physical parameter measuring method using an electronic circuit 1 connected to a capacitive sensor 2 will be explained now in more detail with reference to FIG. 2. A new excitation scheme is proposed with the object of increasing the voltage drop or variation applied to each fixed electrode of the capacitors at the change of each phase for positive biasing and for negative biasing. The large voltage drop on the change from first phase P1 to second phase P2 for positive fixed electrode biasing and for negative fixed electrode biasing, which is the reverse of positive biasing, provides a charge injection across moving electrode CM proportional to the large voltage drop.

The first two phases of the measuring cycle are carried out for example with defined positive biasing of the fixed electrodes C1 and C2, whereas the next two phases are carried out with negative biasing of the fixed electrodes. The duration of each phase may be around 2 μs. However, negative biasing may also be carried out before positive biasing for each measuring cycle or only one positive or negative biasing may be carried out for each measuring cycle.

A voltage may also be set across moving electrode CM at a value comprised between $V_{REG}$ and $V_{SS}$, and preferably at $V_{REG}/2$. This fixed voltage across moving electrode CM may be applied in each first phase P1 of positive biasing and of negative biasing. To achieve this, switching unit 3 further comprises a switch 9, which receives at input a voltage centred on $V_{REG}/2$ and is controlled by a phase control signal ph so as to apply this centred voltage to electrode CM in each first phase P1. This voltage centred at $V_{REG}/2$ can also be obtained at the connection node of two identical resistors of a resistive divider connected between $V_{REG}$ and $V_{SS}$. This may be a condition for removing the first order electrostatic forces applied to moving electrode CM.

In the first phase P1 of positive biasing, the voltage $V_{C1}$ applied to fixed electrode C1 is equal to $V_{DAC\_Pp}$, whereas voltage $V_{C2}$ applied to fixed electrode C2 is equal to $V_{SS}$. In the second phase P2 of positive biasing, voltage $V_{C1}$ applied to fixed electrode C1 is equal to $V_{SS}$, whereas voltage $V_{C2}$ applied to fixed electrode C2 is equal to $V_{DAC\_Pn}$. In first phase P1 of negative biasing, voltage $V_{C1}$ applied to fixed electrode C1 is equal to $V_{DAC\_Np}$, whereas voltage $V_{C2}$ applied to fixed electrode C2 is equal to $V_{REG}$. Finally, in the second phase P2 of negative biasing, voltage $V_{C1}$ applied to fixed electrode C1 is equal to $V_{REG}$, whereas voltage $V_{C2}$ applied to fixed electrode C2 is equal to $V_{DAC\_Nn}$.

The value of voltage $V_{DAC}$, supplied by digital-analogue converter 7 in each phase, is thus $V_{DAC\_Pp}$, $V_{DAC\_Pn}$, $V_{DAC\_Np}$ et $V_{DAC\_Nn}$ in succession. Voltage $V_{DAC\_Pp}$ corresponds to a voltage value Vp added to or subtracted from a reference voltage Vref if, for example, there is a measured acceleration. This voltage value Vp is representative of the first binary word or digital measuring signal stored in one of the registers of the logic unit, preferably relative to an initial rest value with no acceleration. This initial value, which represents an initial reference binary word, may be defined in the logic unit as a value centred on the middle of the measurement range, i.e. at a digital value equal to 512 for a digital range from 0 to 1023 (10 bits).

The first binary word DACbus is supplied to a multiplexer 17 of the digital-analogue converter 7 of FIG. 1, which is connected to each node of the resistors of resistive divider 27. According to the value of the first binary word in positive biasing, voltage Vp is added to or subtracted from the rest reference voltage Vref to determine the voltage $V_{DAC\_Pp}$ supplied to fixed electrode C1. Voltage $V_{DAC\_Pn}$ corresponds to the voltage Vref at which, according to the value of a second binary word in positive biasing, voltage Vp is subtracted from or added to reference voltage Vref, conversely to or from voltage $V_{DAC\_Pp}$. The positive biasing register in the logic unit can store a first binary word of first phase P1 so as to instruct the converter for example to supply at output the voltage Vref+Vp ($V_{DAC\_Pp}$) to be supplied for the fixed electrode of first capacitor C1. The logic unit determines the second binary word, which is complementary to the first binary word. This second binary word is supplied to the converter multiplexer so that it supplies at output the voltage Vref–Vp ($V_{DAC\_Pn}$) in second phase P2 to the fixed electrode of the second capacitor C2. This second binary word is the reverse of the first binary word of said register relative to a reference binary word, which is preferably at the centred value defined in the logic unit. For each positive biasing, the voltage variation offset across the two fixed electrodes from phase P1 to phase P2 is situated at two times the value of voltage Vp.

For negative biasing, the voltage $V_{DAC\_Np}$ corresponds to a voltage value Vn added to or subtracted from an inverted reference voltage $V_{REG}$–Vref if there is, for example, a measured acceleration. This voltage value Vn is representative of a third binary word or digital measuring signal stored in one of the registers of the logic unit, preferably relative to an initial rest value with no acceleration. The third binary word is supplied to the converter so that it supplies in first phase P1 the voltage $V_{DAC\_Np}$, which has a value for example of ($V_{REG}$–Vref)–Vn. The logic unit also determines a fourth binary word, which is complementary to the third binary word to be supplied to the converter. This fourth binary word is the reverse of the third binary word relative to the reference binary word or to the centred value defined in the logic unit. The fourth binary word allows the converter to supply voltage $V_{DAC\_Nn}$, which has a value for example of ($V_{REG}$–Vref)+

Vn, in second phase P2. For each negative biasing, the voltage variation offset across the two fixed electrodes from phase P1 to phase P2 is situated at two times the value of voltage Vn.

If there is no measured acceleration, all the voltages $V_{DAC}$ supplied in each phase of the measuring cycles are all at reference voltage Vref for positive biasing and at inverted reference voltage $V_{REG}$–Vref for negative biasing. Value Vref is represented by the straight line eq1 for positive biasing, and the value $V_{REG}$–Vref is represented by the straight line eq2 for negative biasing. Reference voltage Vref is determined to be between $V_{REG}/2$ and $V_{REG}$ and preferably close to $V_{REG}$. The arrangement of resistive divider 27 and multiplexer 17 may be selected so that reference voltage Vref is supplied at a value for example equal to 1.36 V, whereas the regulated voltage may be 1.65 V. In these circumstances, the inverted reference voltage $V_{REG}$–Vref may have a value for example equal to 0.29 V.

Reference voltage Vref is selected to be close to $V_{REG}$, while leaving a positive biasing variation margin for measuring the physical parameter, such as an acceleration. This voltage value Vref equal to 1.36 V is defined to take account of any possible offset compensation of the MEMS sensor, which may be around 12.3 g and a gain of the MEMS sensor which may 1.5 times greater than the nominal gain.

Measuring sensitivity is thus considerably increased relative to a measurement carried out in accordance with a state of the art measuring method. The voltage variation from phase P1 to phase P2 across each fixed electrode of the capacitors is much higher than $V_{REG}/2$. In this case, for each fixed electrode of the capacitors the measurement starts at reference voltage Vref in positive biasing phases P1 and P2, whereas previously the measurement would start at a value of $V_{REG}/2$ equals 0.825 V. The measuring sensitivity of the present invention is thus 1.65 (1.36V/0.825V) times greater than the sensitivity of a state of the art measuring method.

In first phase P1 and second phase P2 for positive biasing pol0 and negative biasing pol1 of the fixed electrodes, electrostatic forces Fel1 and Fel2 are applied to common electrode CM. An electrostatic force Fel1 between the fixed electrode of the first capacitor C1 and the moving electrode CM is applied, whereas an electrostatic force Fel2 is applied between the fixed electrode of second capacitor C2 and moving electrode CM. A mean of these 8 electrostatic forces may be defined for each measuring cycle. This electrostatic force mean may be expressed by the following formula:

$$Fel_{mean}=(Fel1_{P1\_pol0}+Fel2_{P1\_pol0}+Fel1_{P2\_pol0}+Fel2_{P2\_pol0}+Fel1_{P2\_pol0}+Fel2_{P1\_pol1}+Fel1_{P2\_pol1}+Fel2_{P2\_pol1})/8$$

The electrostatic force Fel1 may for example be expressed as the differential coefficient of the capacitive energy along the degree of freedom:

$$Fel1=\partial E_{capacitive}/\partial x = 0.5 \cdot (\epsilon_0 \cdot S/x^2) \cdot (u1-um)^2$$

where $\epsilon_0$ is a vacuum permittivity constant, S is the surface of the electrode, u1 and um are the electrostatic potentials across electrodes C1 and CM, and x the movable distance between electrodes C1 and CM.

The electrostatic force applied to CM can thus be expressed as:

$$Fel_{mean}=\epsilon/8 \cdot ((V_{REG}^2/2) \cdot ((1/(D0/2-Dx))^2 - (1/(D0/2+Dx))^2) + 2 \cdot (((V_{REG}/2-Vref-V_{DAC})/(D0/2-Dx))^2 - ((V_{REG}/2-Vref+V_{DAC})/(D0/2+Dx))^2)$$

where Dx is the variation of x, which is small relative to D0, which is the distance released between electrodes CM and C2. It is assumed that the stable state value of $V_{DAC}$ corresponds to a charge injection equal to 0 across electrode CM during the transition from phase P1 to phase P2. This stable state value of $V_{DAC}$ can thus be approximated as follows:

$$V_{DAC}=(Cs1-Cs2)/(Cs1+Cs2)) \cdot Vref=(Dx/x) \cdot Vref$$

Thus, according to the above assumption, the first order mean of the electrostatic forces applied across the moving electrode CM is cancelled out, when the distance Dx is small compared to distance D0. This means that the measured acceleration is small. It is however to be noted that the remaining second order electrostatic forces may cause a slight non-linearity, which is within an acceptable range and is not detrimental to the improved sensitivity obtained by the measuring method of the present invention. For the measurement in the two positive biasing phases P1 and P2 and in the case where the moving electrode has moved in the direction of the fixed electrode of capacitor C2, this gives a larger capacitive value Cs2 than capacitive value Cs1 of first capacitor C1. In these conditions, in first phase P1, voltage Vp is added to reference voltage Vref, whereas voltage Vp is subtracted from reference voltage Vref in second phase P2. This measuring voltage Vp increases from an initial value of 0 V, which corresponds for example to a binary word DACbus set at 1000000000 (10 bits) or 10000000000 (11 bits) supplied to the digital-analogue converter up to a final physical parameter measurement value after a certain number of successive measuring cycles. There may be, for example, 8, 12, 16 or 32 measuring cycles to obtain a final measurement value, but preferably a few cycles are sufficient with this new fixed electrode excitation scheme.

Voltage $V_{DAC\_Pp}$ thus has a value of Vref+Vp, which is the voltage $V_{C1}$ applied to the fixed electrode of capacitor C1, whereas voltage $V_{DAC\_Pn}$ has a value of Vref–Vp, which is the voltage $V_{C2}$ applied to the fixed electrode of capacitor C2. At the change from first phase P1 to second phase P2 of positive biasing, the voltage variation $\Delta V_{C1}$ across the fixed electrode of first capacitor C1 is equal to Vref+Vp, whereas the voltage variation $\Delta V_{C2}$ across the fixed electrode of the second capacitor C2 is equal to Vref–Vp. According to the equation $\Delta Q_{CM}=Cs1 \cdot \Delta V_{C1} - Cs2 \cdot \neq V_{C2}$, the difference in charge injection quantity $\Delta Q_{CM}$ across moving electrode CM becomes equal to 0, once the digital positive biasing measuring signal stabilises at a final value.

For negative biasing, which is the reverse of positive biasing, a measuring voltage Vn is added to or subtracted from the inverted reference voltage $V_{REG}$–Vref in phase P1 and phase P2. If the capacitance Cs2 of second capacitor C2 is greater than the capacitance Cs1 of the first capacitor C1, the voltage Vn is subtracted from the inverted reference voltage $V_{REG}$–Vref in first phase P1, whereas voltage Vn is added to inverted reference voltage $V_{REG}$–Vref in second phase P2. As previously indicated, this measuring voltage Vn decreases from an initial value of 0 V to a final physical parameter measurement value after a certain number of successive measuring cycles. Voltage $V_{DAC\_Np}$ thus has a value of $(V_{REG}$–Vref$)$–Vn, which is the voltage $V_{C1}$ applied to the fixed electrode of capacitor C1, whereas the voltage $V_{DAC\_Nn}$ has a value of $(V_{REG}$–Vref$)$+Vn, which is the voltage $V_{C2}$ applied to the fixed electrode of capacitor C2. Voltage Vref+Vn corresponds to voltage variation $\Delta V_{C1}$ across the fixed electrode of first capacitor C1 at the change from first phase P1 to second phase P2. Voltage Vref–Vn corresponds to the voltage variation $\Delta V_{C2}$ across the fixed electrode of second capacitor C2 at the change from first phase P1 to second phase P2. For negative biasing, the difference in charge injection quantity $\Delta Q_{CM}$ across moving electrode Cm also becomes equal to 0, once the digital negative biasing measuring signal stabilises at a final value. In a linear electronic circuit, voltage Vn may match voltage Vp.

Naturally, if moving electrode CM moves in the direction of the fixed electrode of first capacitor C1, capacitive value Cs1 becomes greater than capacitive value Cs2 of second capacitor C2. In these conditions, voltage $V_{DAC\_Pp}$ thus has a value of Vref−Vp which is the voltage $V_{C1}$ applied to the fixed electrode of capacitor C1 in first phase P1, whereas voltage $V_{DAC\_Pn}$ has a value of Vref+Vp, which is the voltage $V_{C2}$ applied to the fixed electrode of capacitor C2 in second positive biasing phase P2. Voltage $V_{DAC\_Np}$ thus has a value of $(V_{REG}-Vref)+Vn$ which is the voltage $V_{C1}$ applied to the fixed electrode of capacitor C1 in first phase P1, whereas voltage $V_{DAC\_Nn}$ has a value of $(V_{REG}-Vref)-Vn$, which is the voltage $V_{C2}$ applied to the fixed electrode of capacitor C2 in second negative biasing phase P2.

From the description that has just been given, multiple variants of the method of measuring a physical parameter and the electronic interface circuit for the capacitive sensor for implementing the same can be devised by those skilled in the art without departing from the scope of the invention defined by the claims. It is possible to envisage altering the duration of each phase in relation to the other, or the duration of each cycle during the physical parameter measuring operations, as well as the number of successive measuring cycles for each measurement conversion. The order of the positive and negative biasing can be altered in each measuring cycle. It is also possible to use only positive or negative biasing for each measuring cycle.

What is claimed is:

1. A method of measuring a physical parameter by means of an electronic interface circuit connected to a capacitive sensor, which includes at least first and second differential-connected capacitors, whose common electrode is capable of moving relative to each fixed electrode of the two capacitors to modify the capacitive value of each capacitor when the physical parameter is measured, said electronic circuit including a charge transfer amplifier, which is connected to the common electrode, a logic unit connected to the amplifier output for digital processing of the data supplied by the amplifier and for supplying at least one digital measuring signal, a digital-analogue converter for supplying a measuring voltage, which is defined on the basis of conversion of at least a first binary word or a second binary word relating to the digital measuring signal, a switching unit for alternately supplying each fixed electrode of the two capacitors with the measuring voltage and a regulated voltage or a low voltage from a supply voltage source, the method including, in each successive measuring cycle, steps consisting in:

a) in a first phase, biasing the fixed electrode of the first capacitor via the switching unit with a first measuring voltage supplied by the digital-analogue converter, and the fixed electrode of the second capacitor with the low voltage for defined positive biasing of the electrodes, or the regulated voltage for defined negative biasing of the electrodes, the first measuring voltage being defined on the basis of the first binary word relating to the digital measuring signal from a preceding cycle or an initial binary reference word supplied by the logic unit, and according to a reference voltage generated in the digital-analogue converter for positive biasing, or according to an inverted reference voltage generated in the digital-analogue converter for negative biasing, the inverted reference voltage corresponding to the difference between the regulated voltage and the reference voltage, which is set at a value higher than half of the regulated voltage, b) in a second phase, biasing the fixed electrode of the second capacitor via the switching unit with a second measuring voltage supplied by the digital-analogue converter and the fixed electrode of the first capacitor with the low voltage or the regulated voltage, the second measuring voltage being defined on the basis of the second binary word relating to the digital measuring signal or the initial reference binary signal supplied by the logic unit, and according to the reference voltage, if positive biasing is selected in the first phase, or according to the inverted reference voltage, if negative biasing is selected in the first phase, the second binary word being defined in the logic unit as the reverse of the first binary word relative to the reference binary word, and c) incrementing or decrementing by a determined step in the logic unit, the digital measuring signal according to the increase or decrease in charge injection quantity across the moving electrode on the basis of the voltage variation across the fixed electrode of the first capacitor and the voltage variation across the fixed electrode of the second capacitor at the change from the first phase to the second phase.

2. The measuring method according to claim 1, wherein each measuring cycle includes a first series of measuring phases with a first phase and a second phase according to steps a) and b) with positive or negative biasing of the fixed electrodes of the capacitors for the supply of a first digital measuring signal in the logic unit, and a second series of measuring phases with a first phase (P1) and a second phase according to steps a) and b) with inverted biasing of the fixed electrodes of the first series of measuring phases for the supply of a second digital measuring signal in the logic unit.

3. The measuring method according to claim 2, wherein the logic unit includes a first register for storing the first digital measuring signal, and a second register for storing the second digital measuring signal, wherein each physical parameter measurement starts on the basis of a final digital value for each digital signal stored in the first register and the second register from a preceding measurement.

4. The measuring method according to claim 1, wherein in each first phase of the measuring cycles, the moving electrode of the first and second capacitors is biased at a voltage comprised between the low voltage and the regulated voltage.

5. The measuring method according to claim 4, wherein the moving electrode of the first and second capacitors is biased in each first phase at a voltage equal to half of the regulated voltage.

6. The measuring method according to claim 1, wherein the reference voltage or the inverted reference voltage are generated in the digital-analogue converter by means of a resistive divider connected in a first direction to the supply voltage source between the regulated voltage and the low voltage to define positive biasing with the reference voltage and connected in a second opposite direction to the first direction to the voltage supply source to define negative biasing with the inverted reference voltage, each node of the resistors of the resistive divider being connected to a multiplexer controlled by the first binary word or the second binary word so as to supply, via the switching unit, the first measuring voltage to the fixed electrode of the first capacitor in the first phase and the second measuring voltage to the fixed electrode of the second capacitor in the second phase.

7. The measuring method according to claim 6, wherein the reference voltage is established in the digital-analogue converter at a value higher than or equal to 1.5 times half the regulated voltage, and wherein the reference binary word corresponds to a digital value in the logic unit in the middle of the measuring range to be supplied at the start of the measuring cycles to the multiplexer of the digital-analogue converter, so as to supply a measuring voltage equal to the reference voltage for positive biasing of the fixed electrodes and an inverted reference voltage for negative biasing of the fixed electrodes.

8. An electronic interface circuit for a capacitive sensor, which includes a pair of differential-connected capacitors, for implementing the measuring method according to claim 1, the electronic circuit including a charge transfer amplifier to be connected to the common electrode of the capacitors, a logic unit connected to the amplifier output for digital processing of data supplied by the amplifier and for supplying at least one digital measuring signal, a digital-analogue converter for supplying a measuring voltage, which is defined on the basis of conversion of at least a first binary word or a second binary word relating to the digital measuring signal, a switching unit capable of alternately supplying each fixed electrode of the two capacitors with the measuring voltage, and a regulated voltage or a low voltage from a supply voltage source, wherein the digital-analogue converter includes a resistive divider for generating a reference voltage for positive biasing of the fixed electrodes of the capacitors, or an inverted reference voltage for negative biasing of the fixed electrodes, each node of the resistors of the resistive divider being connected to a multiplexer, which may be controlled by the first binary word or the second binary word to allow the digital-analogue converter to supply a first measuring voltage on the basis of the first binary word and the reference voltage or the inverted reference voltage, and a second measuring voltage on the basis of the second binary word and the reference voltage or the inverted reference voltage.

9. The electronic circuit according to claim 8, wherein the resistive divider of the digital-analogue converter includes more than 1000 matched resistors having the same resistive value, for example 1536 individual resistors.

10. The electronic circuit according to claim 8, wherein the logic unit includes a first register for storing a first digital measuring signal for positive biasing of the fixed electrodes of the capacitors, and a second register for storing a second digital measuring signal for negative biasing of the fixed electrodes of the capacitors, and wherein the logic unit is arranged to combine or add the first digital measuring signal stored in the first register and the second digital measuring signal stored in the second register to supply a digital output signal.

11. The electronic circuit according to claim 8, wherein it includes a first supply multiplexer and a second supply multiplexer, the first and second supply multiplexers being arranged to receive at input the regulated voltage and the low voltage, wherein the output of the first supply multiplexer is connected to a first terminal of the resistive divider, wherein the output of the second supply multiplexer is connected to a second terminal of the resistive divider, and wherein the first and second multiplexers are controlled by a polarity control signal in order to supply the regulated voltage to the first terminal of the resistive divider and the low voltage to the second terminal of the resistive divider, to generate the reference voltage for positive biasing, and to supply the low voltage to the first terminal of the resistive divider and the regulated voltage to the second terminal of the resistive divider, to generate the inverted reference voltage for negative biasing.

* * * * *